United States Patent
Miyazaki et al.

(10) Patent No.: US 9,171,972 B2
(45) Date of Patent: Oct. 27, 2015

(54) METHOD FOR PRODUCING PHOTOELECTRIC CONVERTER AND PHTOELECTRIC CONVERTER

(71) Applicant: KYOCERA Corporation, Kyoto-shi, Kyoto (JP)

(72) Inventors: Shiro Miyazaki, Kyoto (JP); Tomofumi Honjo, Higashiomi (JP); Koji Niwa, Souraku-gun (JP); Hironori Kii, Kizugawa (JP); Shigeo Aono, Souraku-gun (JP); Yosuke Nishioka, Souraku-gun (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 14/375,537

(22) PCT Filed: Jan. 30, 2013

(86) PCT No.: PCT/JP2013/052098
§ 371 (c)(1),
(2) Date: Jul. 30, 2014

(87) PCT Pub. No.: WO2013/115275
PCT Pub. Date: Aug. 8, 2013

(65) Prior Publication Data
US 2015/0001657 A1 Jan. 1, 2015

(30) Foreign Application Priority Data
Jan. 30, 2012 (JP) ................................ 2012-017018
Jun. 28, 2012 (JP) ................................ 2012-145039

(51) Int. Cl.
*H01L 31/00* (2006.01)
*H01L 31/0216* (2014.01)
(Continued)

(52) U.S. Cl.
CPC ........ *H01L 31/0216* (2013.01); *H01L 31/0224* (2013.01); *H01L 31/02167* (2013.01); *H01L 31/022425* (2013.01); *H01L 31/1804* (2013.01); *Y02E 10/547* (2013.01)

(58) Field of Classification Search
CPC ............ H01L 31/0264; H01L 31/0224; H01L 31/1804
USPC ......................................................... 257/431
See application file for complete search history.

(56) References Cited

U.S. PATENT DOCUMENTS

2011/0232746 A1* 9/2011 Carroll et al. .................. 136/256
2012/0241894 A1* 9/2012 Kudo ............................. 257/433
(Continued)

FOREIGN PATENT DOCUMENTS

EP 2388833 A2 11/2011
JP 07-162001 A 6/1995
(Continued)

OTHER PUBLICATIONS

International Search Report (Form PCT/ISA/210) dated Mar. 12, 2013 issued for PCT/JP2013/052098.

*Primary Examiner* — Nathan Ha
(74) *Attorney, Agent, or Firm* — Procopio, Cory, Hargreaves & Savitch, LLP

(57) ABSTRACT

The method for producing a photoelectric converter of the present invention comprises a preparation step for preparing a substrate (2) formed from silicon; a first film-formation step for the formation of a first protective film (3) by deposition of aluminum oxide on a top surface (2B) of the substrate (2) using the atom deposition method or chemical vapor deposition method in an atmosphere containing hydrogen; and a second film-formation step for forming a second protective film (4) by deposition of aluminum oxide on the first protective film (3) using sputtering after the first film-formation step. Moreover, the photoelectric converter of the present invention comprises a substrate formed from silicon; a first protective film formed from aluminum oxide; and a second protective film formed from aluminum oxide, wherein the concentration of hydrogen contained in the first protective film is higher than the concentration of hydrogen contained in the second protective film.

6 Claims, 7 Drawing Sheets

(51) Int. Cl.
*H01L 31/0224* (2006.01)
*H01L 31/18* (2006.01)

(56) References Cited

U.S. PATENT DOCUMENTS

2012/0255612 A1* 10/2012 Pierreux ............... 136/261
2013/0247972 A1* 9/2013 Mungekar et al. ............ 136/256
2013/0255769 A1* 10/2013 Carroll et al. ............... 136/256
2013/0270489 A1* 10/2013 Wang et al. ................ 252/514
2013/0313547 A1* 11/2013 Nakano et al. ................ 257/43
2014/0193944 A1* 7/2014 Woods et al. ................ 438/95

FOREIGN PATENT DOCUMENTS

JP 2006-332510 A 12/2006
JP 2011-249813 A 12/2011

* cited by examiner ental, the substrate 2 is a p-type semiconductor substrate. By forming an opposite conductivity type layer 22, or n-type layer, in the p-type semiconductor substrate, a photoelectric conversion layer 2a having a pn junction is formed. The substrate 2, if it is made of monocrystalline silicon, may be formed by, for example, a crystal pulling method or the like. Also, the substrate 2, if it is made of polycrystalline silicon, may be formed by, for example, casting or the like. In the following description, a p-type polycrystalline silicon substrate is used as the substrate 2. However, an n-type polycrystalline silicon substrate may be used as the substrate 2.

METHOD FOR PRODUCING PHOTOELECTRIC CONVERTER AND PHTOTELECTRIC CONVERTER

TECHNICAL FIELD

The present invention relates to a method for manufacturing a photoelectric conversion element and to a photoelectric conversion element.

BACKGROUND ART

A photoelectric conversion element, which converts light into electricity, may be provided with a protective film on the surface of the substrate to suppress the recombination carriers, generated in the photoelectric conversion layer, at the surface of the substrate. Such a protective film is generally formed by atomic layer deposition (ALD) or chemical vapor deposition (CVD) in view of damage to the surface of the substrate (see, for example, Japanese Unexamined Patent Application Publication No. 2011-249813).

SUMMARY OF INVENTION

When the protective film on the substrate is subjected to heat application, however, hydrogen can be released from the protective film. If hydrogen has been released from the protective film, carriers become easy to recombine at the surface of the substrate. Consequently, the lifetime of the carriers is reduced. This makes it difficult to increase the current extracted from the substrate.

Accordingly, it is an object of the present invention to provide a method for manufacturing a photoelectric conversion element adapted to suppress the release of hydrogen from the protective film on the surface of the substrate, and to provide such a photoelectric conversion element.

The method for manufacturing a photoelectric conversion element according to the present invention includes the following steps. The method performs the preparation step of preparing a silicon substrate including a photoelectric conversion layer, the first deposition step of forming a first protective film by depositing aluminum oxide on the substrate by atomic layer deposition or chemical vapor deposition in an atmosphere containing hydrogen, and the second deposition step of forming a second protective film after the first deposition step by depositing aluminum oxide on the first protective film by sputtering or application.

The photoelectric conversion element of the present invention includes a silicon substrate including a photoelectric conversion layer, a first protective film made of aluminum oxide deposited on the substrate, and a second protective film made of aluminum oxide deposited on the first protective film. The first protective film contains hydrogen with a higher concentration than the second protective film.

According to the method for manufacturing a photoelectric conversion element of the present invention, the release of hydrogen from the first protective film is suppressed even when the first protective film is heated. Thus, the protective film maintains the capability thereof to protect the substrate, consequently inhibiting carriers from recombining each other at the surface of the substrate. A higher current can therefore be extracted from the substrate.

In addition, in the photoelectric conversion element of the present invention, since the hydrogen concentration in the first protective film is higher than that in the second protective film, the surface recombination at the substrate can be reduced.

DESCRIPTION OF EMBODIMENTS

Figure 1:
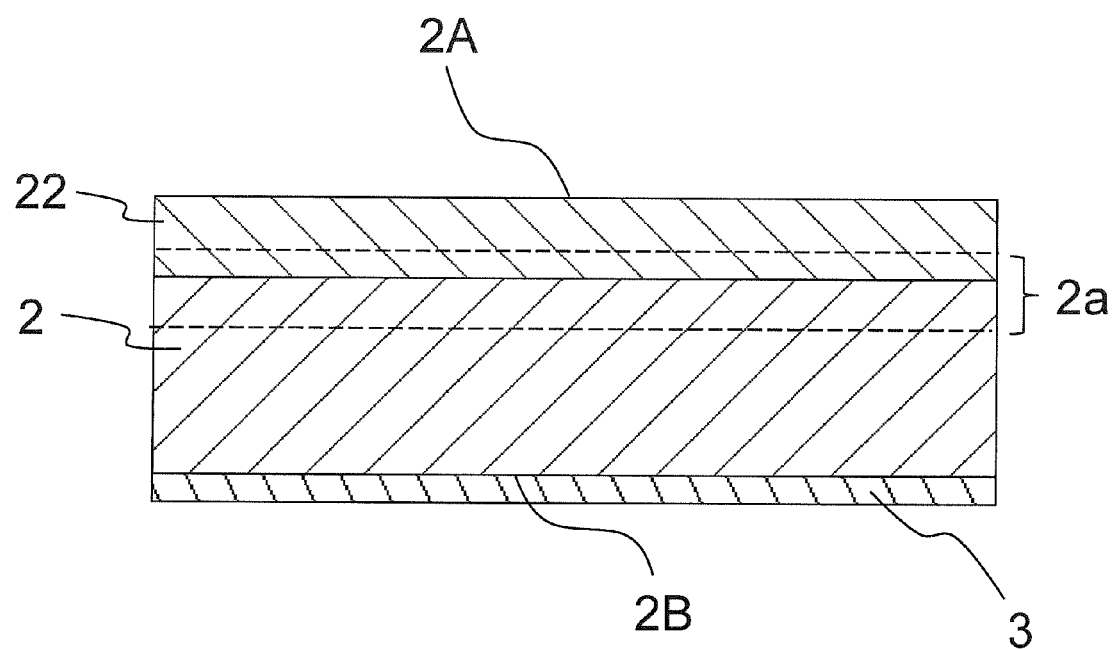
FIG. 1 is a sectional view illustrating a step of a method for manufacturing a photoelectric conversion element of the present invention, taken in the thickness direction.

A method for manufacturing a photoelectric conversion element according to an embodiment of the present invention will now be described with reference to the drawings.

<Method for Manufacturing Photoelectric Conversion Element>

The method for manufacturing a photoelectric conversion element according to the embodiment of the present invention includes the preparation step of preparing a substrate 2, the first deposition step of depositing a first protective film 3, and the second deposition step of depositing a second protective film 4. Each of these steps will be described in detail below with reference to the drawings.

(Preparation Step)

The step of preparing a substrate 2 including a photoelectric conversion layer 2a will be described. In the present embodiment, the substrate 2 is a p-type semiconductor substrate. By forming an opposite conductivity type layer 22, or n-type layer, in the p-type semiconductor substrate, a photoelectric conversion layer 2a having a pn junction is formed. The substrate 2, if it is made of monocrystalline silicon, may be formed by, for example, a crystal pulling method or the like. Also, the substrate 2, if it is made of polycrystalline silicon, may be formed by, for example, casting or the like. In the following description, a p-type polycrystalline silicon substrate is used as the substrate 2. However, an n-type polycrystalline silicon substrate may be used as the substrate 2.

First, a polycrystalline silicon ingot is produced by, for example, casting. Then, the ingot is sliced to a thickness of, for example, 250 µm or less. At this time, a fixed abrasive wire saw apparatus is used to slice the ingot. This wire saw is a type which slices an object with a fixed abrasive wire to which grains are bonded. Then, the substrate 2 contaminated by the slicing operation is cleaned using a cleaning solution. According to the observation of the section of the substrate 2 through a scanning electron microscope, the use of the fixed abrasive type can reduce the number of microcracks and also reduce the depth of the microcracks to about 1 µm or less relative to the use of a loose abrasive type.

Also, according to estimation of the residual stress at the surface of the substrate 2 by micro-raman spectroscopy, the surface sliced with the fixed abrasive type has a compressive stress in the range of 200 MPa to 500 MPa, whereas the compressive stress in the use of a loose abrasive type is 200 MPa or less. It is thus assumed that the use of a fixed abrasive type helps produce a substrate 2 which has less mechanically damaged layers and from which residual stress is not much released by occurrence of microcracks or the like.

In the following step, the opposite conductivity type layer 22 is formed from the first surface 2A of the substrate 2. The opposite conductivity type layer 22 may be formed by, for example, an application-thermal diffusion process in which a $P_2O_5$ paste is applied to the surface of the semiconductor substrate 1 and is then thermally diffused, or a gas phase thermal diffusion process using $POCl_3$ (phosphoryl chloride) gas as a diffusion source. The opposite conductivity type layer 22 has a depth, for example, in the range of 0.2 μm to 2 μm, and a sheet resistance, for example, in the range of, 40 Ω/sq. to 200 Ω/sq.

In the gas phase diffusion process, for example, a phosphate glass coating is formed over the surface of the substrate 2 by heat-treating the substrate 2 at a temperature, for example, in the range of 600° C. to 800° C. for 5 to 30 minutes in an atmosphere containing a diffusion gas containing $POCl_3$ or the like. Then, phosphorus is diffused into the substrate 2 from the phosphate glass by heat-treating the substrate 2 for, for example, 10 to 40 minutes at a high temperature in the range of, for example, 800° C. to 900° C. in an atmosphere of inert gas such as argon or nitrogen, thus forming the opposite conductivity type layer 22.

By forming the opposite conductivity type layer 22 in the substrate 2, a pn junction is formed at the interface between the substrate 2 and the opposite conductivity type layer 22. The region of the pn junction will act as the photoelectric conversion layer 2a. The substrate 2 including a photoelectric conversion layer 2a, as shown in FIG. 1, is thus prepared.

(First Deposition Step)

Subsequently, the first protective film 3 is formed on a second surface 2B of the substrate 2, as shown in FIG. 1. The first protective film 3 may be formed on both or either the first surface 2A or the second surface 2B. Also, the first protective film 3 may be further formed on other faces (lateral sides or the like) of the substrate 2 than the first surface 2A and the second surface 2B.

The first protective film 3 can be formed of aluminum oxide. Examples of the aluminum oxide used for the first protective film 3 include $Al_2O_3$, AlO, $AlO_2$, $Al_2O$, and $Al_2O_2$.

An aluminum oxide having a composition deviating from the stoichiometry may be used as the aluminum oxide of the first protective film 3 so that the first protective film 3 has fixed charges. Since the second substrate 2 is of p-type semiconductor, the fixed charges in the first protective film 3 can be set negative. For a first protective film 3 having negative fixed charges, for example, aluminum may be reduced from the stoichiometric composition, or oxide may be increased from the stoichiometric composition.

The first protective film 3 is formed in such a manner that aluminum oxide is deposited on the surface of the substrate 2. Preferably, a process that does not easily damage the second surface 2B of the substrate 2 is applied for forming the first protective film 3. More specifically, ALD, CVD or the like can be applied as the process for depositing aluminum oxide on the second surface 2B of the substrate 2. By applying such a process for forming the first protective film 3, the possibility of damage to the second surface 2B of the substrate 2 can be reduced. Thus, the surface of the substrate 2 can be maintained in comparison with the state thereof before deposition.

In the description of the present embodiment, the first protective film 3 is formed by depositing aluminum oxide on the substrate 2 by ALD. More specifically, an ALD process, in principle, enables aluminum atomic layers and oxygen atomic layers to be alternately formed on the substrate 2. More specifically, an aluminum material gas and an oxidizing gas are alternately delivered to form the aluminum oxide first protective film 3.

The pressure in the ALD for forming the first protective film 3 may be set to, for example, $1 \times 10^4$ Pa or less. The aluminum material gas may be trimethyl aluminum or the like. The oxidizing gas may be oxygen, ozone, $H_2O$, or the like. The temperature for forming the first protective film 3 may be set, for example, in the range of 100° C. to 350° C. The thickness of the first protective film 3 may be set, for example, in the range of 1 nm to 100 nm. The deposition rate may be, for example, 0.1 nm/min.

The first protective film 3 is formed in an atmosphere containing hydrogen. The atmosphere containing hydrogen may be in any conditions as long as the atmosphere in which the first protective film 3 is formed contains hydrogen atoms. Thus, the deposition may be performed while a gas containing hydrogen may be delivered to the atmosphere, or gas delivery may be suspended in the course of deposition in a state where hydrogen is present in the atmosphere. By depositing aluminum oxide on the substrate 2 in an atmosphere containing hydrogen, hydrogen is taken into the resulting first protective film 3. In this instance, the hydrogen concentration in the atmosphere may be adjusted to control the concentration of the hydrogen to be taken into the first protective film 3.

The presence of hydrogen in the first protective film 3 facilitates the termination of dangling bonds around the surface of the substrate 2, thus reducing the surface recombination at the substrate 2.

The hydrogen concentration in the atmosphere may be varied as time passes. By varying the hydrogen concentration, the hydrogen concentration in the first protective film 3 can be controlled in the thickness direction.

For example, in the first deposition step of forming the first protective film 3, the hydrogen concentration in the atmosphere may be reduced as time passes. Consequently, the hydrogen concentration in the resulting first protective film 3 is reduced in the direction away from the substrate 2. Hence, the first protective film 3 contains a larger amount of hydrogen in a region closer to the substrate 2 and a smaller amount of hydrogen in a region closer to the second protective film 4.

In general, when the hydrogen content is low, the crystallinity can be increased. Hence, the crystallinity can be increased toward the second protective film 4. The first protective film 3 having such a hydrogen concentration distribution, therefore, enables the surface recombination at the substrate 2 to be reduced. In addition, the moisture resistance of such a first protective film 3 is enhanced in a region closer to the second protective film 4.

(Second Deposition Step)

Figure 2:
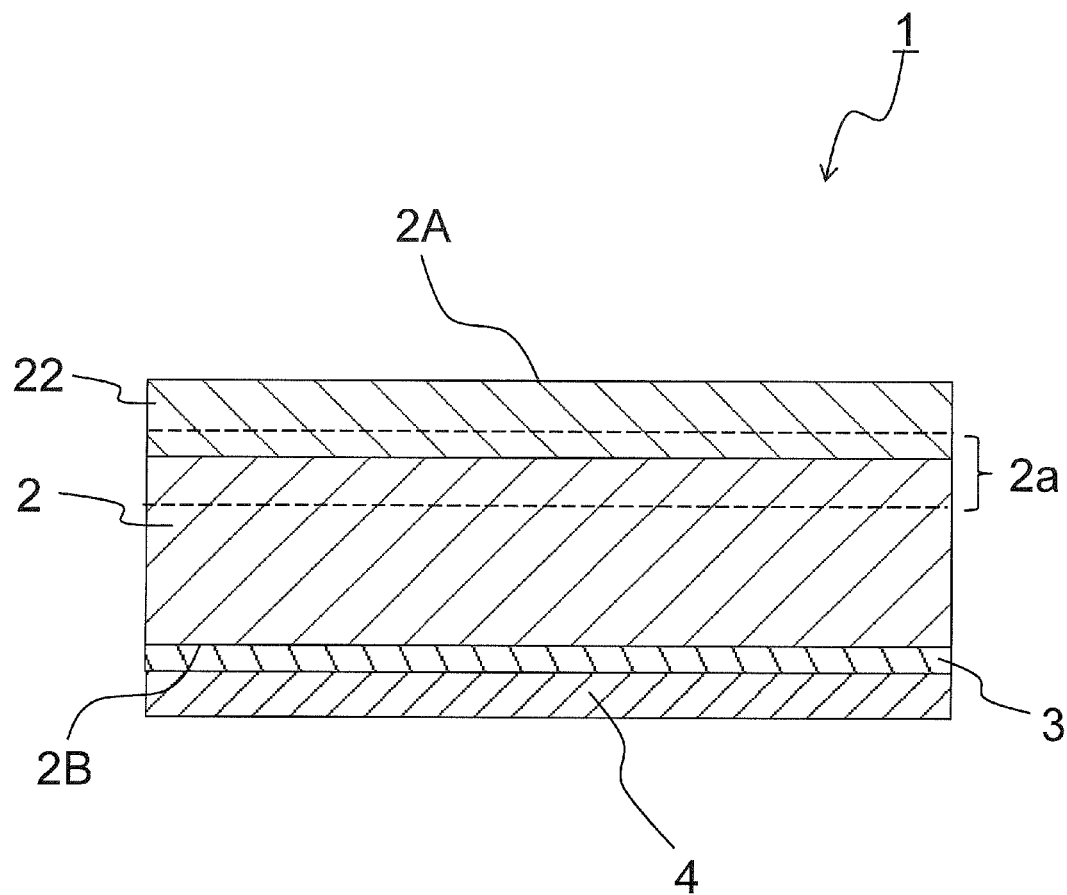
FIG. 2 is a sectional view illustrating a step of the method for manufacturing a photoelectric conversion element of the present invention.

After the first deposition step, the second protective film 4 is formed on the first protective film 3, as shown in FIG. 2. The second protective film 4 may be formed by depositing aluminum oxide on the first protective film 3 by sputtering or application.

The second protective film 4 may be formed to a thickness, for example, in the range of 10 nm to 200 nm. The aluminum oxide of the second protective film 4 may contain other materials as long as it contains aluminum oxide. A second protective film 4 made of a simple aluminum oxide can have a thermal expansion coefficient close to the first protective film 3, and such a second protective film 4 is difficult to separate from the first protective film 3.

For forming the second protective film 4, for example, ALD, CVD, vapor deposition or the like may be applied instead of sputtering or application. Even in the case of forming the second protective film 4 by sputtering, the second surface 2B of the substrate 2 does not easily damaged because of the presence of the first protective film 3 on the second surface 2B of the substrate 2.

In a sputtering process, deposition can be performed at a rate of, for example, 1 nm/min or more. The deposition rate of the second protective film 4 is adjusted in view of the damage to the substrate 2 from sputtering and the thickness of the first protective film 3. In other words, by controlling the thickness of the first protective film 3, the deposition rate of the second protective film 4 can be adjusted.

Exemplary application processes for forming the second protective film 4 include spin coating, printing, liquid ejection, spraying, dripping, ink jet method, nozzle printing, or dispensing. For application, a solution containing aluminum oxide is used. The solution may be prepared, for example, by dissolving molten alumina (crystalline alumina) in an organic solvent.

In the deposition of the second protective film 4 by spin coating, for a substrate 2 of, for example, a square of 150 µm to 200 µm on a side, 1 mL to 10 mL of the solution is dripped onto the substrate 2, and the spinning speed may be set in the range of 450 rpm to 650 rpm. The spinning time may be set, for example, in the range of 5 s to 50 s. Then, the substrate 2 is spun at a speed in the range of 1500 rpm to 2300 rpm for a time in the range of 15 s to 30 s to yield the second protective film 4.

After the deposition of the second protective film 4 by application, a drying step is performed. The drying step may be conducted by natural drying, or by forcible drying such as heating in a furnace. For forcible drying, the temperature of the atmosphere may be set, for example, in the range of 100° C. to 200° C. Under this temperature condition, heating time may be set, for example, in the range of 5 minutes to 20 minutes.

Since, in the present embodiment, the second protective film 4 is formed on the first protective film 3, the second protective film 4 keeps hydrogen from being released from the first protective film 3 even if heat is applied to the first protective film 3. Thus, the capability of the first protective film 3 to protect the substrate 2 is prevented from being degraded by heating the substrate 2. Consequently, recombination at the surface of the substrate 2 is suppressed and, accordingly, the lifetime of carriers produced in the substrate 2 is lengthened. Thus, the current extracted from the substrate 2 of the photoelectric conversion element 1 can be increased.

Also, the second protective film 4 formed by sputtering is easily charged with fixed negative charges. This is probably because aluminum oxide film formed by sputtering tends to contain many aluminum defects and, thus, of which the entirety is easily charged with fixed negative charges. Consequently, minority carriers in the p-type substrate 2 are easily repelled inward from the interface between the substrate 2 and the first protective film 3, and thus the photoelectric conversion efficiency in the substrate 2 is increased.

(Modification 1 of Photoelectric Conversion Element Manufacturing Method)

The second deposition step may be performed in an atmosphere containing hydrogen. The hydrogen in the atmosphere may be set in the same manner as in the first deposition step. By forming the second protective film 4 in an atmosphere containing hydrogen, the resulting second protective film 4 contains hydrogen. Therefore, part of the hydrogen in the second protective film 4 can be diffused into the first protective film 3 by heating in the step of forming electrodes, described later.

Thus, part of the hydrogen in the second protective film 4 is diffused into the first protective film 3 while the hydrogen in the first protective film 3 is kept from being released. Also, even if the hydrogen in the first protective film 3 is released during heating of the substrate 2, the decrease in hydrogen content in the first protective film 3 can be suppressed because hydrogen is supplied from the second protective film 4. Furthermore, if the concentration of the hydrogen supplied from the second protective film 4 has a higher concentration than the concentration of the hydrogen released from the first protective film 3, the hydrogen concentration in the first protective film 3 can be increased. Thus, the capability of the first protective film 3 to protect the substrate 2 can be further enhanced.

(Modification 2 of Photoelectric Conversion Element Manufacturing Method)

The method for manufacturing the photoelectric conversion element may further include an application step and an electrode forming step.

(Application Step)

Figure 3:
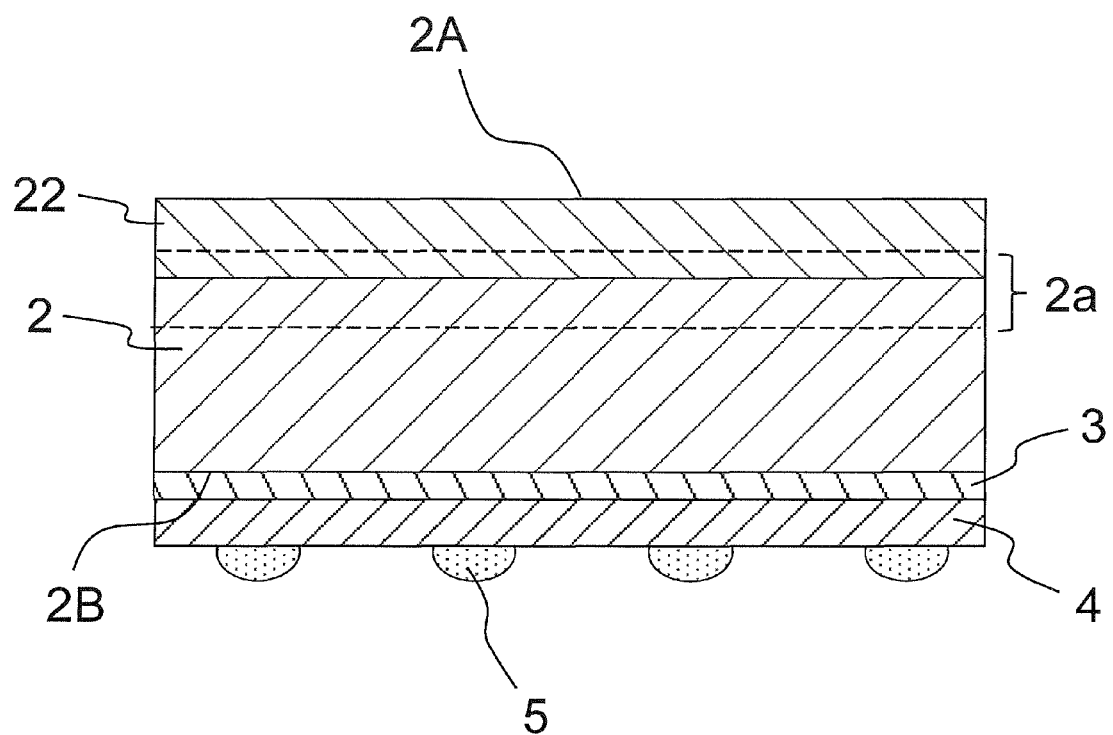
FIG. 3 is a sectional view illustrating a step of a method for manufacturing a photoelectric conversion element according to a modification of the present invention.

After the second deposition step, an electrically conductive paste 5 is applied in a predetermined pattern onto the second protective film 4, as shown in FIG. 3. The conductive paste 5 may contain, for example, aluminum, tin, magnesium, silver, or the like. The material of the conductive paste 5 can be selected depending on the conductivity type of the semiconductor to be connected to. The thickness of the conductive paste 5 can be set according to the thicknesses of the second protective film 4 and the first protective film 3, and may be, for example, in the range of 5 µm to 30 µm.

When the conductive paste 5 is connected to a p-type semiconductor, a material mainly containing, for example, aluminum may be selected for the conductive paste 5. When the conductive paste 5 is connected to an n-type semiconductor, a material mainly containing, for example, silver may be selected. The present embodiment will illustrate the case where electrodes 6 are electrically connected to the p-type side of the substrate 2. Accordingly, a material mainly containing aluminum is used for the conductive paste 5.

Such a conductive paste 5 is applied in a predetermined pattern onto the second protective film 4. The conductive paste 5 will penetrate the second protective film 4 and the first protective film 3 through the subsequent step of forming electrodes, thus forming the electrodes 6. The conductive paste 5 is therefore applied in substantially the same predetermined pattern as the pattern of the electrodes 6. The application of the conductive paste 5 may be performed by, for example, screen printing or the like.

The predetermined pattern in which the conductive paste 5 is applied can be formed as desired. When electrodes are formed at the side of the second surface 2B of the substrate 2, for example, the electrodes 6 may be formed in a circular or polygonal shape in plan view in such a manner that the electrodes 6 come into point-contact with the substrate 2. On the other hand, when the electrodes are formed at the side of the first surface 2A (light-receiving face) of the substrate 2, for example, a bas bar electrode, a comb electrode or the like may be formed.

The method may further include the step of forming an antireflection film before the application step. The antireflection film can be provided according to the wavelength of incoming light. The antireflection film may be formed of, for example, silicon nitride or the like.

(Electrode Forming Step)

After the application step, the first protective film 3, the second protective film 4 and the conductive paste 5 are heated. The heating temperature and the heating time can be appropriately set according to the materials and thicknesses of the first protective film 3, the second protective film 4 and the conductive paste 5. For example, the heating temperature may be set in the range of 500° C. to 900° C. The heating time may be set, for example, in the range of 1 minute to 30 minutes.

Figure 4:
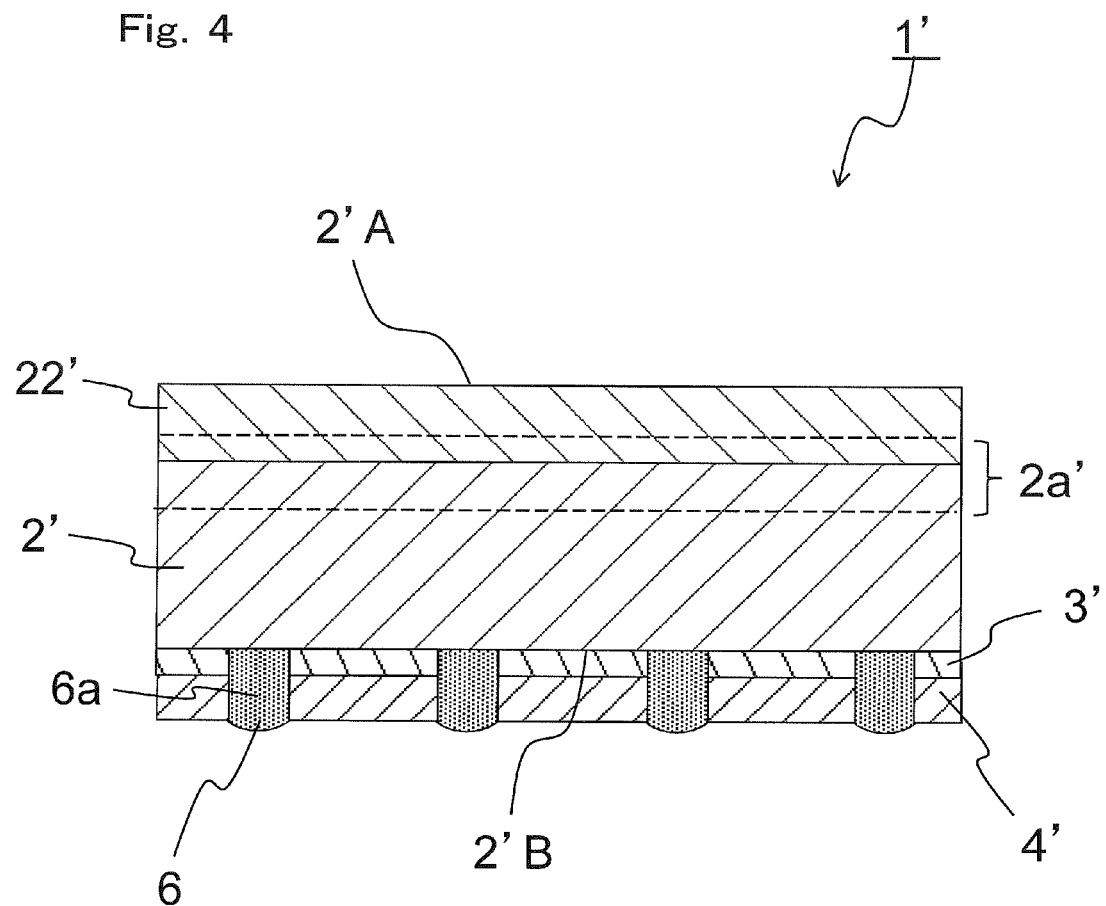
FIG. 4 is a sectional view illustrating a step of a method for manufacturing a photoelectric conversion element according to a modification of the present invention.

This heating enables the aluminum in the conductive paste 5 to partially penetrate the second protective film 4 and the first protective film 3 and thus to form electrically conductive paths 6a as shown in FIG. 4. The ends of the conductive paths 6a are brought into contact with the second surface 2'B of the substrate 2'. Furthermore, part of the each conductive path 6a in contact with the substrate 2 diffuses into the substrate 2' to form an ohmic contact with the substrate 2'. The thus formed electrodes 6 extend to the substrate 2 from the top of the second protective film 4 through the conductive paths 6a, thus electrically connected to the substrate 2.

Here, the photoelectric conversion element 1' is the photoelectric conversion element 1 subjected to heating. The substrate 2', the first protective film 3' and the second protective film 4' are the substrate 2, the first protective film 3 and the second protective film 4 after heating, respectively.

(Modification 3 of Photoelectric Conversion Element Manufacturing Method)

The method may further include the first heating step of heating the first protective film 3 between the first deposition step and the second deposition step. The heating temperature and heating time of the first heating step can be set as desired, as long as the density of the first protective film 3 can be increased from that before heating. The heating temperature for the first protective film 3 may be set, for example, lower than the melting point (2054° C.) of aluminum oxide, such as 500° C. or less. The heating time may be set, for example, in the range of 1 minute to 60 minutes. The density of the first protective film 3 may be set higher than that of the second protective film 4.

By thus increasing the density of the first protective film 3, the properties thereof such as moisture resistance and impact resistance can be enhanced. Consequently, the first protective film 3 can be prevented from being degraded in protection capability in the second deposition step. If sputtering is applied to the second deposition step, the possibility of damage to the substrate 2 can be further reduced.

Figure 5A:
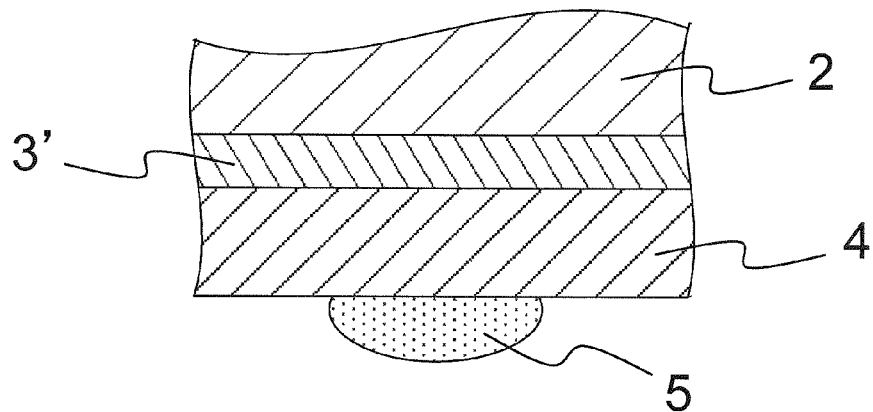
FIGS. 5A to 5C show sectional views illustrating steps of a method for manufacturing a photoelectric conversion element according to a modification of the present invention.
Figure 5B:
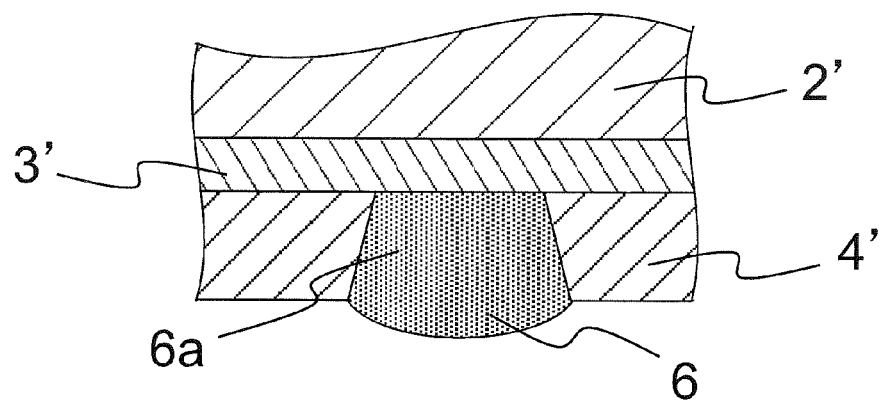
Figure 5C:
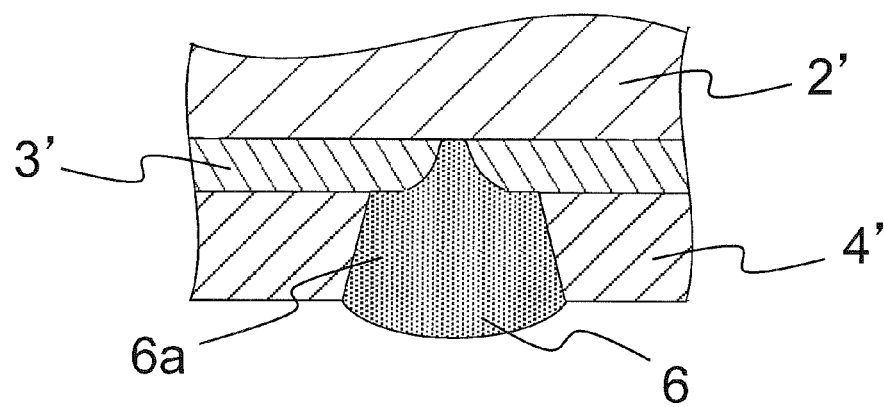

If the method includes such a step, an electrode forming step is performed after increasing the density of the first protective film 3 and then performing the second deposition step and the application step. At this time, as shown in FIGS. 5A to 5C, the conductive paste 5 applied onto the second protective film 4 (FIG. 5A) penetrates the second protective film 4 (FIG. 5B), and further penetrates the first protective film 3' having a higher density from the second protective film 4 (FIG. 5C). The first protective film 3 having a higher density as in this case hinders the penetration of part of the conductive paste 5. Consequently, the conductive paths 6a become thin in the first protective film 3'.

Since the width of the conductive paths 6a is reduced, the contact area between the conductive paths 6a and the second surface 2'B of the substrate 2' is reduced. Thus, the diffusion region in which a material diffuses into the substrate 2' from the contact area can be reduced.

Since the diffusion region in the substrate 2' is thus reduced, the lifetime of the carriers in the substrate 2' can further be lengthened. On the other hand, the width of the conductive paths 6a in the second protective film 4' is maintained. This can minimize the increase of the interconnection resistance of the electrodes 6.

Although the present modification has illustrated a technique for forming conductive paths 6a in which the density of the first protective film 3 is increased by heating, other techniques may be applied. For example, the first deposition step may be performed under a higher pressure than the second deposition step. In this instance, the first deposition step and the second deposition step may use the same deposition apparatus. Thus pressure control becomes easy and productivity can be further increased.

Also, by varying the deposition conditions and deposition method in the first deposition step and the second deposition step, the densities of the first protective film 3 and the second protective film 4 can be varied. More specifically, this can be achieved through the first deposition step performed by ALD and the second deposition step performed by sputtering or application. This is because ALD performed under general deposition conditions can provide a denser protective film than sputtering or the like.

The first heating step may be performed in an atmosphere containing hydrogen. By performing the first heating step in an atmosphere containing hydrogen, the density of the first protective film 3 can be increased, and hydrogen can be introduced to the first protective film 3. Since the hydrogen content in the first protective film 3 is thus increased, the protection capability for the substrate 2 can be further increased.

(Modification 4 of Photoelectric Conversion Element Manufacturing Method)

The method may further include the second heating step of heating the second protective film 4 between the second deposition step and the electrode forming step. The heating temperature and heating time in the second heating step may be adjusted as required, as long as the density of the second protective film 4 is increased from that before heating. The heating temperature for the second protective film 4 is set, for example, lower than the melting point of aluminum oxide (2054° C.), such as 500° C. or less. The heating time may be set in the range of, for example, 1 minute to 60 minutes.

Since the density of the second protective film 4 is increased from that before heating by heating, the protection capability for the first protective film 3 can be enhanced. In addition, by increasing the density of the second protective film 4 as above, hydrogen becomes difficult to diffuse from the first protective film 3 into the second protective film 4' in the electrode forming step. Consequently, the first protective film 3 is prevented from being degraded in protection capability for the substrate 2.

(Modification 5 of Photoelectric Conversion Element Manufacturing Method)

In the second deposition step, the second protective film 4 may be formed to a larger thickness than the first protective film 3. By forming the second protective film 4 to a larger thickness, the thickness of the first protective film 3 can be reduced. The deposition method, the deposition conditions and the like for the first protective film 3 are determined in view of damage to the second surface 2B of the substrate 2. Since ALD or CVD is suitably used in the first deposition step, productivity is reduced in some cases. By reducing the thickness of the first protective film 3, the time taken for the first deposition step can be reduced and the productivity of the photoelectric conversion element 1 can be increased.

For a known photoelectric conversion element, the deposition of the protective film on the substrate is performed by only ALD or CVD. Accordingly, the deposition step takes a very long time, and it is difficult to enhance the productivity. In a deposition process where the protective film is formed only by sputtering, sputtering damages the surface of the substrate, and accordingly it is difficult to increase the photoelectric conversion efficiency.

<Photoelectric Conversion Element>

A photoelectric conversion element produced by a photoelectric conversion element manufacturing method according to an embodiment of the present invention will now be described.

Figure 6:
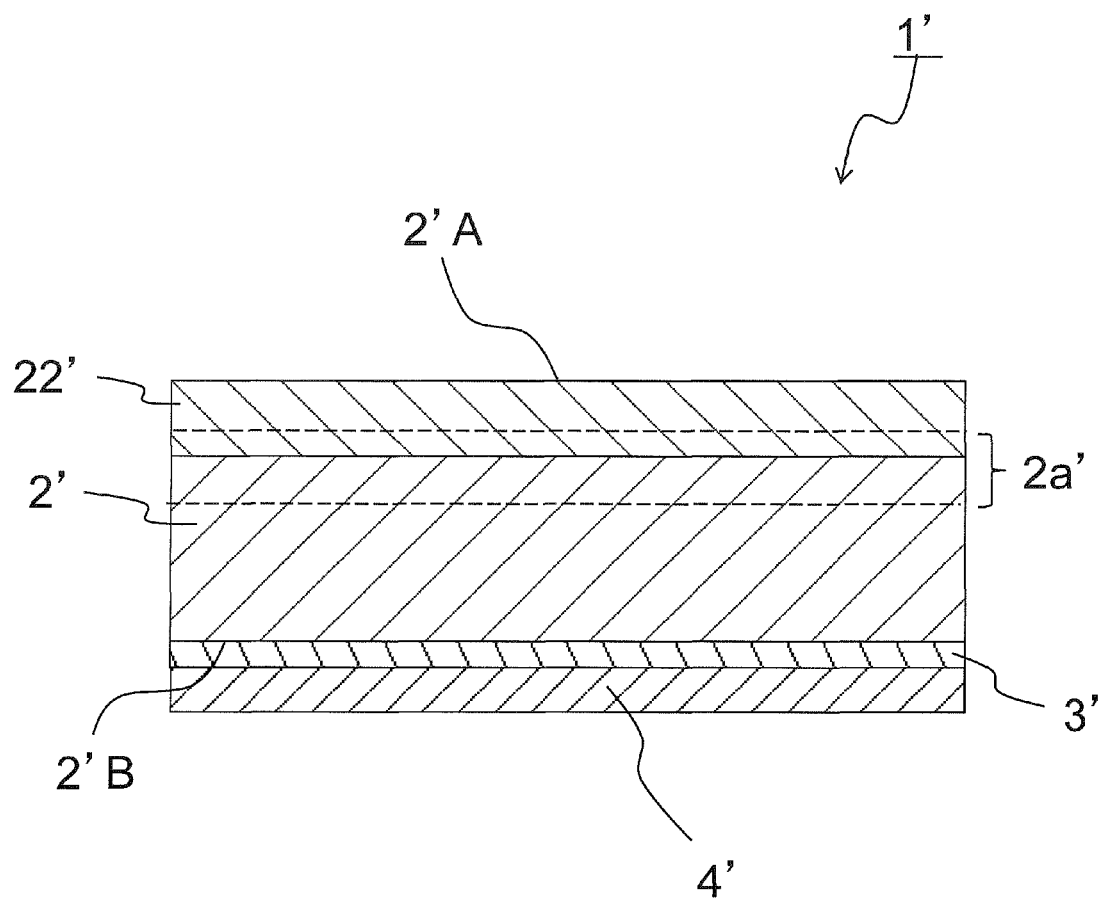
FIG. 6 is a sectional view of a photoelectric conversion element produced by a method for manufacturing a photoelectric conversion element according to the present invention.

The photoelectric conversion element of an embodiment of the present invention includes a substrate 2', a first protective film 3' and a second protective film 4', as shown in FIG. 6. The substrate 2', the first protective film 3' and the second protective film 4' can be provided in a process according to, but not limited to, the above-described photoelectric conversion element manufacturing method.

Figure 7:
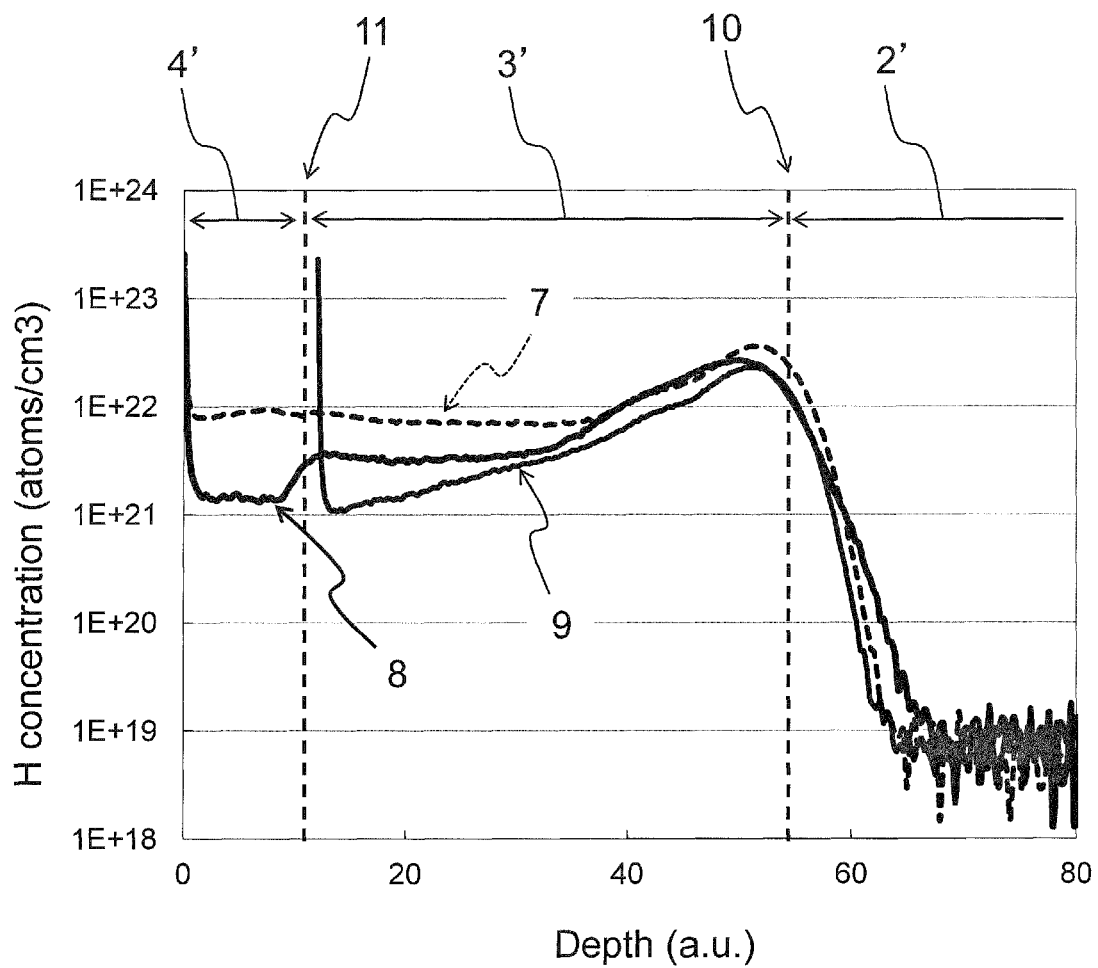
FIG. 7 is a plot of analysis results of a photoelectric conversion element produced by a method for manufacturing a photoelectric conversion element of the present invention.

Even though the photoelectric conversion element 1 produced by the photoelectric conversion element manufacturing method of the present invention is heated, the structure in which the second protective film 4' overlies the first protective film 3' makes it difficult to release hydrogen from the first protective film 3'. In the photoelectric conversion element 1', therefore, the hydrogen concentration in the first protective film 3' is higher than that in the second protective film 4', as shown in FIG. 7 for Example 2 described later. In this instance, the hydrogen concentration in the first protective film 3' may be controlled so that the lowest hydrogen concentration is twice or more the lowest hydrogen concentration in the second protective film 4'.

Since the hydrogen concentration in the first protective film 3' is higher than that in the second protective film 4', dangling bonds around surface of the substrate 2' are easily terminated, and accordingly, surface recombination at the substrate 2' is reduced. Consequently, the lifetime of the carriers generated in the substrate 2' is lengthened, and the current extracted from the substrate 2' of the photoelectric conversion element 1' is increased.

(Modification of Photoelectric Conversion Element)

For the hydrogen concentration in the thickness direction of the first protective film 3', the highest value may lie closer to the substrate 2', as shown in FIG. 7. When the highest value of the hydrogen concentration in the first protective film 3' lies closer to the substrate 2' as in the case above, a large amount of hydrogen is present around the interface between the first protective film and the substrate 2'. This further facilitates the termination of the surface of the substrate 2'. Consequently, surface recombination at the substrate 2' can be further reduced.

The hydrogen concentration may be controlled so as to satisfy the relationship (C3−C2)>(C2−C1), where C1 represents the hydrogen concentration in the first protective film 3' at the interface with the second protective film 4', C2 represents the hydrogen concentration in the first protective film 3' at a point having a thickness half that of the first protective film 3', and C3 represents the hydrogen concentration at a point at which the hydrogen concentration is highest. In other words, in FIG. 7, the gradient of the line through concentrations C2 and C3 is larger than the gradient of the line through concentrations C1 and C2.

When the hydrogen concentration in the first protective film 3' is controlled as above, the first protective film 3' has a portion in which the hydrogen concentration increases toward the substrate 2', but the hydrogen concentration around the interface with the second protective film 4' does not vary much. The surface of the substrate 2' is therefore easily terminated at the interface between the first protective film and the substrate 2'. On the other hand, at the interface between the first protective film 3' and the second protective film 4', the variation in hydrogen concentration is small. This leads to stabilized crystallinity and enhanced moisture resistance.

EXAMPLES

Specific examples according to an embodiment of the present invention will now be described.

Example 1

First, a p-type silicon substrate of a square of 156 mm on a side with a thickness of about 200 μm was prepared as the substrate 2. More specifically, the substrate 2 was formed by slicing a silicon ingot so that the first surface 2A and the second surface 2B are exposed. Then, the surface of the substrate 2 was slightly etched with the 10-fold diluted aqueous solution of hydrofluoric acid to remove the mechanically damaged layer and contaminated layer at the section of the substrate 2. Subsequently, phosphorus was diffused into the substrate 2 from the first surface 2A of the substrate 2, thereby forming the opposite conductivity type layer 22.

Subsequently, the first deposition step was performed by ALD. In the first deposition step, a first protective film 3 mainly containing aluminum oxide was formed over the surfaces of the substrate 2. The first deposition step was performed on the substrate 2 in a chamber of a deposition apparatus. In the first deposition step, deposition was performed in the chamber in an atmosphere containing hydrogen. Trimethyl aluminum was used as the material gas, and ozone, oxygen and $H_2O$ were used as the oxidizing gas. The temperature of the substrate during deposition was about 150° C. Thus a first protective film 3 was formed on the substrate 2. The first protective film 3 was set to a thickness of 5 nm.

Then, the substrate 2 provided with the first protective film 3 was subjected to the second deposition step for forming the second protective film 4. The second deposition step was performed by sputtering. In the second deposition step, a second protective film 4 was formed only on the first protective film 3 on the lower surface 2B of the substrate 2. The second protective film 4 was a film mainly containing aluminum oxide. For sputtering, reactive sputtering was performed using aluminum as the target. The second protective film 4 was set to a thickness of 15 nm (for Sample S1), or 25 nm (for Sample S2), as shown in the following Table 1. In Table 1, Sample S0 represents the case where the second protective film 4 was not formed in the second deposition step (the thickness of the second protective film 4 was 0 nm).

Then, the substrate 2 provided with the first protective film 3 and the second protective film 4 was subjected to the application step and the electrode forming step. Thus, photoelectric conversion elements (Samples S0 to S2) including electrodes 6 including conductive paths 6a were produced. In addition, a photoelectric conversion element provided only with a first protective film by ALD was produced as the Comparative Example. These photoelectric conversion elements were exposed to artificial sunlight, and photoelectrically converted current and voltage were measured. The results are shown in Table 1.

TABLE 1

| Sample | ALD | SP | SP/ALD | Conversion efficiency (%) |
|--------|------|-------|--------|---------------------------|
| S0 | 5 nm | 0 nm | 0 | 16.997 |
| S1 | 5 nm | 15 nm | 3 | 17.234 |

TABLE 1-continued

| Sample | ALD | SP | SP/ALD | Conversion efficiency (%) |
|---|---|---|---|---|
| S2 | 5 nm | 25 nm | 5 | 17.415 |
| Comparative Example | 40 nm | 0 nm | 0 | 17.159 |

In the Table, "ALD" represents the thickness of the first protective film 3 formed by ALD, and "SP" represents the thickness of the second protective film 4 formed by sputtering. "SP/ALD" represents the ratio of the thickness of the second protective film 4 to the thickness of the first protective film 3.

The results show that when the thickness ratio was 2 or more, the photoelectric conversion efficiency was increased relative to that of the comparative example. It is assumed that when the thickness ratio is in such a range, the second protective film 4' formed by sputtering has a higher fixed charge than the first protective film formed only by ALD. This is probably the reason why conversion efficiency is increased.

Example 2

A photoelectric conversion element 1' produced in the same manner as in Example 1 was subjected to SIMS analysis. For SIMS, a dynamic SIMS was used. The results are shown in FIG. 7. FIG. 7 shows the results of a SIMS analysis performed on the substrate 2', the first protective film 3' and the second protective film 4' of the photoelectric conversion element 1' in the thickness direction from the surface of the second protective film 4'. In FIG. 7, numeral 7 represents the result of analysis on the photoelectric conversion element 1 before heating, numeral 8 represents the result of analysis on the photoelectric conversion element 1' heated at 700° C. Also, in FIG. 7, numeral 9 represents the Comparative Example, in which only the first protective film 3 was formed by ALD.

For the photoelectric conversion element used for the analysis, the first protective film 3 was formed to a thickness of 40 nm, and the second protective film 4 was formed to a thickness of 20 nm. The first protective film 3 was formed by ALD, and the second protective film 4 was formed by sputtering. For the photoelectric conversion element of the Comparative Example, only the first protective film 3 was formed to a thickness of 40 nm by ALD, followed by heating in the same manner.

The values of the thicknesses of the first protective film 3' and the second protective film 4' mentioned in this Example are those set in the apparatus used for deposition, different from the value calculated in the depth direction in the SIMS analysis (horizontal axis) in FIG. 7 in strict sense. In FIG. 7, accordingly, the interface between the substrate 2' and the first protective film 3' and the interface between the first protective film 3' and the second protective film 4' were each estimated to be a point at which the measurement was ½ of the highest value in the region that could be considered to be around the interface. In FIG. 7, dotted line 10 indicates the position estimated to be the interface between the substrate 2' and the first protective film 3', and dotted line 11 indicates the position estimated to be the interface between the first protective film 3' and the second protective film 4'. The interfaces may be estimated by other methods.

The results of SIMS analysis in FIG. 7 show that the first protective film 3' of the photoelectric conversion element 1' subjected to heating contains more hydrogen in comparison between the result of the photoelectric conversion element subjected to heating (8 in FIG. 7) and the result of the photoelectric conversion element of the Comparative Example (9 in FIG. 7). These results suggest that the presence of the second protective film 4' helps maintain the hydrogen content in the first protective film 3'.

The results shown in FIG. 7 also show that the hydrogen concentration in the first protective film 3' was higher than the hydrogen concentration in the second protective film 4'.

The result of the photoelectric conversion element 1' shows that the highest value (2.67 E+22) of the hydrogen concentration in the first protective film 3' lies closer to the substrate 2'. Also, the hydrogen concentration in the first protective film 3' satisfied the relationship (C3−C2)>(C2−C1), where C1 represents the hydrogen concentration (3.03 E+21) at the interface with the second protective film 4', C2 represents the hydrogen concentration (4.01 E+21) in the first protective film 3 at a point having a thickness half that of the first protective film 3, and C3 represents the hydrogen concentration (2.67 E+22) at which the hydrogen concentration was highest.

In addition, the lowest hydrogen concentration (3.07 E+21) in the first protective film 3' was twice or more the lowest hydrogen concentration (1.38 E+21) in the second protective film 4'.

The invention claimed is:

1. A photoelectric conversion element comprising:
a silicon substrate including a photoelectric conversion layer;
a first protective film made of aluminum oxide deposited on the substrate; and
a second protective film made of aluminum oxide deposited on the first protective film,
wherein the first protective film contains hydrogen with a higher concentration than the second protective film,
the density of the first protective film is higher than that of the second protective film, and
the first protective film is in contact with the substrate.

2. The photoelectric conversion element according to claim 1, wherein the highest value of the hydrogen concentration in the thickness direction in the first protective film lies closer to the substrate.

3. The photoelectric conversion element according to claim 2, wherein the hydrogen concentration in the first protective film satisfies the relationship (C3−C2)>(C2−CI), wherein CI represents the hydrogen concentration in the first protective film at the interface with the second protective film, C2 represents the hydrogen concentration in the first protective film at a point having a thickness half the thickness of the first protective film, and C3 represents the hydrogen concentration at a point at which the hydrogen concentration is highest.

4. The photoelectric conversion element according to claim 1, wherein the lowest hydrogen concentration in the first protective film is twice or more the lowest hydrogen concentration in the second protective film.

5. The photoelectric conversion element according to claim 1, wherein the thickness of the second protective film is larger than that of the first protective film.

6. The photoelectric conversion element according to claim 1, wherein the silicon substrate is a crystalline silicon substrate.

* * * * *